(12) United States Patent
Lee et al.

(10) Patent No.: US 10,897,280 B2
(45) Date of Patent: Jan. 19, 2021

(54) ELECTRONIC DEVICE INCLUDING PLURALITY OF ANTENNA ARRAYS

(71) Applicant: Samsung Electronics Co., Ltd., Suwon-si (KR)

(72) Inventors: Jeongho Lee, Suwon-si (KR); Yunsung Cho, Suwon-si (KR); Daehyun Kang, Suwon-si (KR); Byungjoon Park, Suwon-si (KR); Hyunchul Park, Suwon-si (KR); Juho Son, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/725,243

(22) Filed: Dec. 23, 2019

(65) Prior Publication Data

US 2020/0204202 A1 Jun. 25, 2020

(30) Foreign Application Priority Data

Dec. 24, 2018 (KR) ........................ 10-2018-0168447

(51) Int. Cl.
*H03F 3/68* (2006.01)
*H04W 88/08* (2009.01)
(Continued)

(52) U.S. Cl.
CPC ............... *H04B 1/38* (2013.01); *H01L 23/66* (2013.01); *H01Q 1/241* (2013.01); *H01Q 3/26* (2013.01);
(Continued)

(58) Field of Classification Search
None
See application file for complete search history.

(56) References Cited

U.S. PATENT DOCUMENTS 6,472,934 B1 10/2002 Pehlke
7,459,989 B2 * 12/2008 Ezzeddine ............... H03H 7/21
333/132
(Continued)

FOREIGN PATENT DOCUMENTS

WO 02/054589 A1 7/2002

OTHER PUBLICATIONS

IEEE Journal of Solid-State Circuits, vol. 53, No. 5, "A 28-GHz CMOS Direct Conversion Transceiver With Packaged 2 × 4 Antenna Array for 5G Cellular System", Kim et al., May 2018.
(Continued)

*Primary Examiner* — Tuan A Tran
(74) *Attorney, Agent, or Firm* — Jefferson IP Law, LLP

(57) ABSTRACT

A communication method and system for converging a 5th-Generation (5G) communication system for supporting higher data rates beyond a 4th-Generation (4G) system with a technology for Internet of Things (IoT) are provided. The disclosure may be applied to intelligent services based on the 5G communication technology and the IoT-related technology, such as smart home, smart building, smart city, smart car, connected car, health care, digital education, smart retail, security and safety services. The electronic device includes a first antenna module including a first amplifier configured to amplify a signal received from a communication circuit, a second antenna module including a second amplifier configured to amplify a signal received from the communication circuit, and an impedance matching circuit disposed between an output terminal of the first amplifier and an output terminal of the second amplifier.

20 Claims, 5 Drawing Sheets

(51) Int. Cl.
| | |
|---|---|
| H04B 1/38 | (2015.01) |
| H01L 23/66 | (2006.01) |
| H01Q 1/24 | (2006.01) |
| H01Q 3/26 | (2006.01) |
| H01Q 23/00 | (2006.01) |
| H03F 3/21 | (2006.01) |
| H01Q 21/06 | (2006.01) |

(52) U.S. Cl.
CPC .............. *H01Q 23/00* (2013.01); *H03F 3/211* (2013.01); *H01L 2223/6627* (2013.01); *H01L 2223/6655* (2013.01); *H01L 2223/6677* (2013.01); *H01Q 21/06* (2013.01); *H03F 2200/222* (2013.01); *H03F 2200/451* (2013.01)

(56) References Cited

U.S. PATENT DOCUMENTS

| | | | | |
|---|---|---|---|---|
| 8,198,938 | B2* | 6/2012 | Yu | H03F 3/602 |
| | | | | 330/124 R |
| 8,629,722 | B2* | 1/2014 | Bowles | H03F 1/0261 |
| | | | | 330/295 |
| 9,030,255 | B2* | 5/2015 | Liss | H03F 3/68 |
| | | | | 330/149 |
| 9,071,202 | B2* | 6/2015 | Racey | H03F 1/0288 |
| 10,153,736 | B2* | 12/2018 | King | H03F 3/19 |
| 2004/0113698 | A1* | 6/2004 | Kim | H03F 1/0288 |
| | | | | 330/295 |
| 2009/0102553 | A1* | 4/2009 | Yang | H03F 3/601 |
| | | | | 330/124 R |
| 2012/0235734 | A1* | 9/2012 | Pengelly | H03F 3/211 |
| | | | | 330/124 D |
| 2015/0119107 | A1* | 4/2015 | Bouny | H04W 88/08 |
| | | | | 455/561 |
| 2016/0126921 | A1 | 5/2016 | Hur et al. | |
| 2018/0145718 | A1 | 5/2018 | Margomenos | |
| 2018/0180713 | A1 | 6/2018 | Cohen et al. | |
| 2018/0191309 | A1 | 7/2018 | McLaren | |
| 2019/0386617 | A1* | 12/2019 | Naraine | H03F 3/245 |

OTHER PUBLICATIONS

IEEE Journal of Solid-State Circuits, vol. 52, No. 12, "A 28-GHz 32-Element TRX Phased-Array IC With Concurrent Dual-Polarized Operation and Orthogonal Phase and Gain Control for 5G Communications", Sadhu et al., Dec. 2017.

2018 IEEE/MTT-S International Microwave Symposium, "28GHz Phased Array Transceiver in 28nm Bulk CMOS for 5G Prototype User Equipment and Base Stations", Dunworth et al., Jun. 10-15, 2018.

IEEE microwave magazine, "A Handy Dandy Doherty PA", pp. 110-124, Cho et al. Sep. 2017.

2017 IEEE International Solid-State Circuits Conference, "A 28GHz/37GHz/39GHz Multiband Linear Doherty Power Amplifier for 5G Massive MIMO Applications", Hu et al., Feb. 5-9, 2017.

Partial European search report dated Mar. 25, 2020, issued in a counterpart European Application No. 19219545.1-1220.

Extended European search report dated Jun. 9, 2020, issued in a counterpart European Application No. 19219545.1-1220.

Ernst Habekotte et al: "LINC architecture: A discussion", Mixed Design of Integrated Circuits and Systems (MIXDES), 2012 Proceedings of the 19th International Conference, IEEE, May 24, 2012, pp. 139-143, XP032195074, ISBN: 978-1-4577-2092-5.

* cited by examiner

ELECTRONIC DEVICE INCLUDING PLURALITY OF ANTENNA ARRAYS

CROSS-REFERENCE TO RELATED APPLICATION(S)

This application is based on and claims priority under 35 U.S.C. § 119(a) of a Korean patent application number 10-2018-0168447, filed on Dec. 24, 2018, in the Korean Intellectual Property Office, the disclosure of which is incorporated by reference herein in its entirety.

BACKGROUND

1. Field

The disclosure relates to a structure capable of improving the efficiency of an antenna array in an electronic device including a plurality of antenna modules.

2. Description of Related Art

To meet the demand for wireless data traffic having increased since deployment of 4G communication systems, efforts have been made to develop an improved $5^{th}$ generation (5G) or pre-5G communication system. Therefore, the 5G or pre-5G communication system is also called a 'Beyond $4^{th}$ generation (4G) Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid frequency shift keying (FSK) and quadrature amplitude modulation (QAM) Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered to be as an example of convergence between the 5G technology and the IoT technology.

A signal used in a 5G mobile communication system may use a complex modulation scheme to improve a data transmission rate. In the case in which a complex modulation scheme is used, a peak-to-average power ratio (PAPR) characteristic of a signal may be increased, and as the PAPR increases, the efficiency of an antenna module used in a 5G mobile communication system may decrease.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including: a first antenna array including a first amplifier configured to amplify a signal received from a communication circuit, a second antenna array including a second amplifier configured to amplify a signal received from the communication circuit, and an impedance matching unit disposed between an output terminal of the first amplifier and an output terminal of the second amplifier.

Additional aspects will be set forth in part in the description which follows and, in part, will be apparent from the description, or may be learned by practice of the presented embodiments.

In accordance with an aspect of the disclosure, an antenna module is provided. The antenna module includes a first antenna module including a first amplifier configured to amplify a signal received from a communication circuit, a second antenna module including a second amplifier configured to amplify a signal received from the communication circuit, and an impedance matching circuit disposed between an output terminal of the first amplifier and an output terminal of the second amplifier.

According to an embodiment disclosed in the disclosure, it is possible to improve the efficiency of an antenna module in a $5^{th}$ generation (5G) mobile communication system using a multi-chain structure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
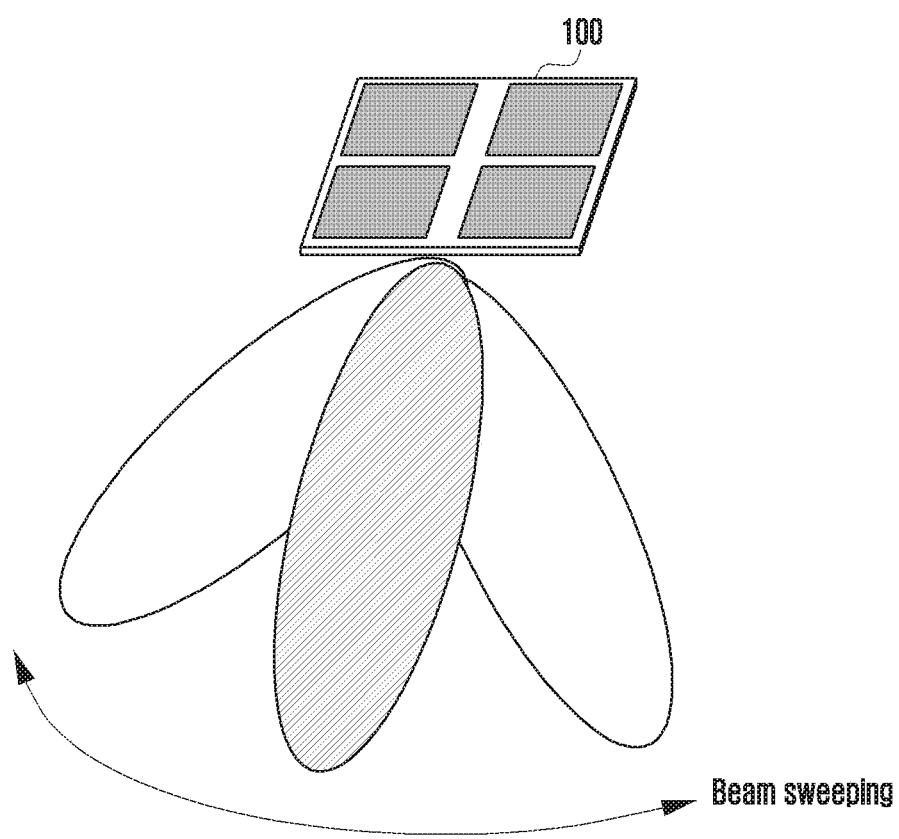
FIG. 1 illustrates beam sweeping through a wireless communication chip according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skilled in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

For the same reason, in the accompanying drawings, some elements may be exaggerated, omitted, or schematically illustrated. Further, the size of each element does not entirely reflect the actual size. In the drawings, identical or corresponding elements are indicated by identical reference numerals.

Here, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, executed via the processor of the computer or other programmable data processing apparatus, create means for implementing the functions specified in the flowchart block or blocks. These computer program instructions may also be stored in a computer-usable or computer-readable memory that can direct a computer or other programmable data processing apparatus to function in a particular manner, such that the instructions stored in the computer-usable or computer-readable memory produce an article of manufacture including instruction means that implement the function specified in the flowchart block or blocks. The computer program instructions may also be loaded onto a computer or other programmable data processing apparatus to cause a series of operations to be performed on the computer or other programmable apparatus to produce a computer implemented process such that the instructions executed on the computer or other programmable apparatus provide operations for implementing the functions specified in the flowchart block or blocks.

In addition, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used herein, the term "unit" refers to a software element or a hardware element, such as a Field Programmable Gate Array (FPGA) or an Application Specific Integrated Circuit (ASIC), which performs a predetermined function. However, "unit" does not always have a meaning limited to software or hardware. The "unit" may be configured to be stored in an addressable storage medium or to be executed one or more processors. Therefore, the "unit" includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the unit may be either combined into a smaller number of elements or units or may be divided into a larger number of elements or units. Moreover, the elements and units may be implemented to be reproduce on one or more central processing units (CPUs) within a device or a security multimedia card. In addition, in an embodiment, the "unit" may include one or more processors.

FIG. 1 illustrates beam sweeping through a wireless communication chip according to an embodiment of the disclosure.

Referring to FIG. 1, a communication system that transmits and receives using mmWave band is fundamentally different from a wireless communication method. For example, in an mmWave band, as the frequency increases, the gain loss of a beam emitted through an electronic device may increase.

According to an embodiment, in an mmWave band, a multi-chain structure may be used to minimize the gain loss of a beam. For example, an electronic device may include at least one wireless communication chip 100, and the at least one wireless communication chip 100 may generate four multi-chains.

According to various embodiments, an electronic device including the wireless communication chip 100 may configure a beam using a multi-chain generated through the wireless communication chip 100, and may perform beam sweeping. That is, a multi-chain may refer to a plurality of radio frequency (RF) chains.

According to an embodiment, 16 or 32 multi-chains may be generated through one wireless communication chip 100. According to various embodiments, an electronic device may include four wireless communication chips, and each wireless communication chip included in the electronic device may generate 32 multi-chains.

Figure 2:
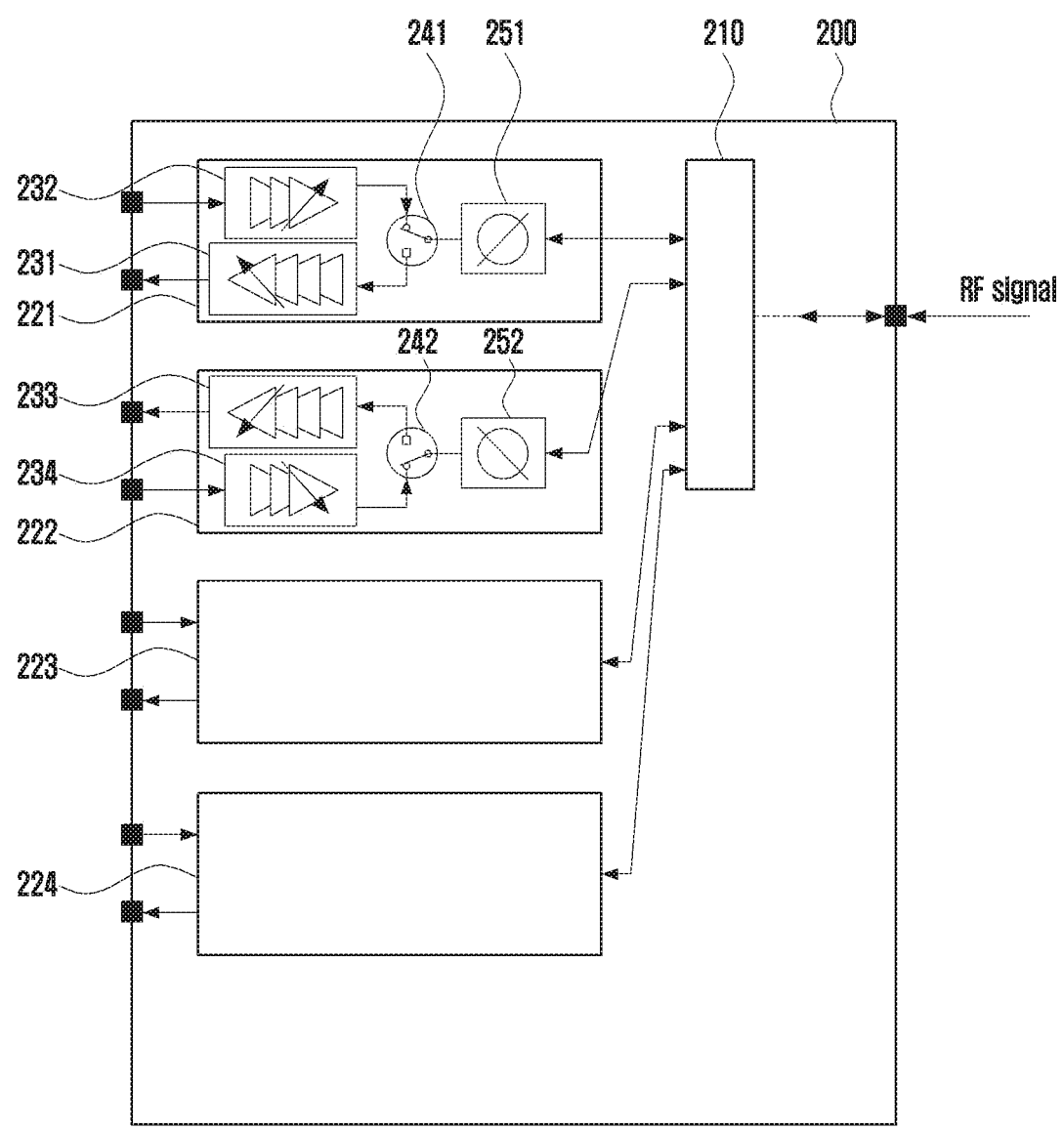
FIG. 2 is a configuration diagram illustrating an electronic device including a multi-chain structure according to an embodiment of the disclosure.

FIG. 2 is a configuration diagram illustrating an electronic device including a multi-chain structure according to an embodiment of the disclosure.

Referring to FIG. 2, an electronic device 200 may include a plurality of antenna modules 221, 222, 223, and 224. For example, a first antenna module 221 may include a first amplifier 231 configured to amplify a signal received from a communication circuit, and a second antenna module 222 may include a third amplifier 233 configured to amplify a signal received from the communication circuit. According to various embodiments, the signal received from the communication circuit may be an RF signal.

According to an embodiment, a signal distributor 210 may transmit the RF signal received from the communication circuit to each of the antenna modules 221, 222, 223, and 224. According to various embodiments, each of the antenna modules 221, 222, 223, and 224 may configure a beam having a specific frequency band on the basis of an RF signal distributed from the signal distributor 210. According to an embodiment, the specific frequency band may be a frequency band used in a 5G mobile communication system. For example, each of the antenna modules 221, 222, 223, 224 may configure a beam having a center frequency of 60 GHz, 39 GHz, or 28 GHz. According to an embodiment, the signal distributor 210 may operate as a signal combiner configured to combine RF signals received by each of the antenna modules 221, 222, 223, and 224.

According to an embodiment, the first antenna module 221 may include a first phase shifter 251 configured to shift the phase of an RF signal distributed from the signal distributor 210, a first switch 241 configured to selectively connect a transmitting terminal and a receiving terminal, a first amplifier 231 connected to a transmitting terminal of the first antenna module 221 for amplifying power of an RF signal supplied from a communication circuit, and a second amplifier 232 connected to an output terminal of the first antenna module 221 for amplifying power of an RF signal supplied from outside the electronic device 200.

According to an embodiment, the first amplifier 231 may be a power amplifier (PA), and the second amplifier 232 may be a low-noise amplifier (LNA). According to various embodiments, the second amplifier 232 has a low noise figure (NF), and thus may generate low noise.

According to an embodiment, the second antenna module 222 may include a second phase shifter 252 configured to shift the phase of an RF signal distributed from the signal distributor 210, a second switch 242 configured to selectively connect a transmitting terminal and a receiving terminal, a third amplifier 233 connected to a transmitting terminal of the second antenna module 222 and amplifying the power of an RF signal supplied from a communication circuit, and a fourth amplifier 234 connected to an output terminal of the second antenna module 222 and amplifying the power of an RF signal supplied from outside the electronic device 200.

According to an embodiment, the third amplifier 233 may be a PA, and the fourth amplifier 234 may be a LNA. According to various embodiments, the fourth amplifier 234 has a low NF, and thus may generate low noise.

According to various embodiments, the internal structures of the third antenna module 223 and the fourth antenna module 224 may also be the same as or similar to the internal structures of the first antenna module 221 and the second antenna module 222. For example, each of the third antenna module 223 and the fourth antenna module 224 may also include a phase shifter, a switch, and a power amplifier corresponding thereto.

According to an embodiment, the electronic device 200 may configure a first chain through the first antenna module 221, a second chain through the second antenna module 222, a third chain through the third antenna module 223, and a fourth chain through the fourth antenna module 224. According to various embodiments, the electronic device 200 may have a multi-chain structure including four chains, which includes the first antenna module 221, the second antenna module 222, the third antenna module 223, and the fourth antenna module 224.

Figure 3:
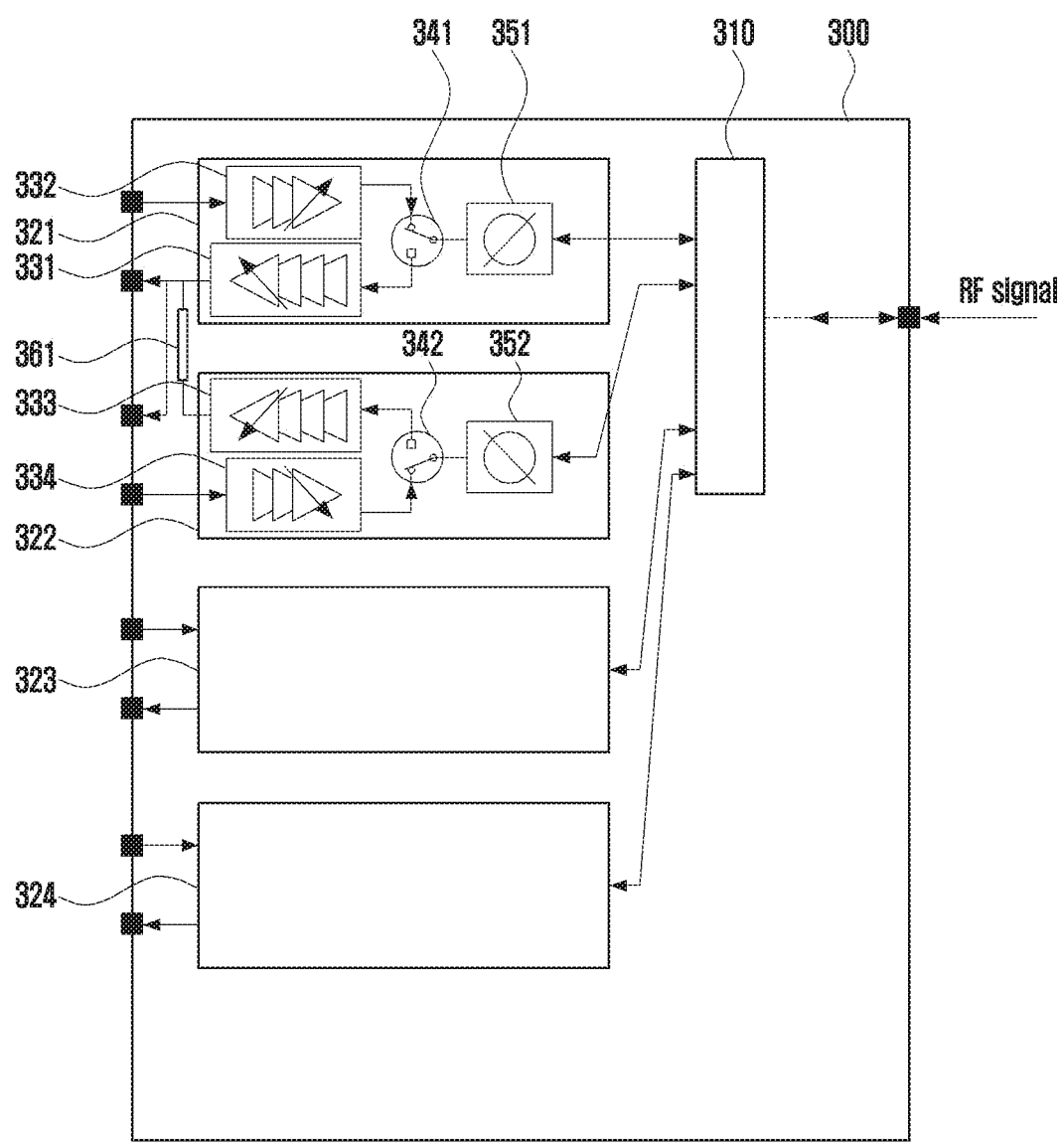
FIG. 3 is a configuration diagram illustrating an electronic device including an impedance matching circuit according to an embodiment of the disclosure.

FIG. 3 is a configuration diagram illustrating an electronic device including an impedance matching unit according to an embodiment of the disclosure.

Referring to FIG. 3, electronic device 300 includes a first antenna module 321 including a first amplifier 331 configured to amplify a signal received from a communication circuit, a second antenna module 322 including a third amplifier 333 configured to amplify the signal received from the communication circuit, and an impedance matching unit 361 disposed between an output terminal of the first amplifier 331 and an output terminal of the third amplifier 333.

According to an embodiment, the impedance matching unit 361 may be a quarter-wave transformer ($\lambda/4$), and may combine output terminals of the first antenna module 321 and the second antenna module 322. According to various embodiments, the impedance matching unit 361 may be a passive device having a phase of $\lambda/4$. For example, if the matching impedance of an output terminal of an electronic device 300 is 50Ω, the characteristic impedance of $\lambda/4$ may be 50Ω.

According to an embodiment, a signal distributor 310 may transmit an RF signal that is received from a communication circuit to each of antenna modules 321, 322, 323, and 324. According to various embodiments, each of the antenna modules 321, 322, 323, and 324 may configure a beam having a specific frequency band based on an RF signal distributed from the signal distributor 310. According to an embodiment, the specific frequency band may be a frequency band used in a 5G mobile communication system. For example, each of the antenna modules 321, 322, 323, 324 may configure a beam having a center frequency of 60 GHz, 39 GHz, or 28 GHz. According to an embodiment, the signal distributor 310 may operate as a signal combiner configured to combine RF signals received by the respective antenna modules 321, 322, 323, and 324.

According to an embodiment, the first antenna module 321 may include a first phase shifter 351 configured to shift a phase of an RF signal distributed from the signal distributor 310, a first switch 341 configured to selectively connect a transmitting terminal and a receiving terminal, and a second amplifier 332 connected to an output terminal of the first antenna module 321 and amplifying the power of an RF signal supplied from outside the electronic device 300.

According to an embodiment, the first amplifier 331 may be a PA, and the second amplifier 332 may be a LNA. According to various embodiments of the disclosure, the second amplifier 332 has a low NF, and thus may generate low noise.

According to an embodiment, the second antenna module 322 may include a second phase shifter 352 configured to shift the phase of an RF signal distributed from the signal distributor 310, a second switch 342 configured to selectively connect a transmitting terminal and a receiving terminal, a third amplifier 333 connected to a transmitting terminal of the second antenna module 322 and amplifying power of an RF signal supplied from a communication circuit, and a fourth amplifier 334 connected to an output terminal of the second antenna module 322 and amplifying the power of an RF signal supplied from outside the electronic device 300.

According to an embodiment, the third amplifier 333 may be a PA, and the fourth amplifier 334 may be a LNA. According to various embodiments of the disclosure, the fourth amplifier 334 has a low NF, and thus may generate low noise.

According to an embodiment, there may be a difference between the phase of an RF signal shifted by the first phase shifter 351 and the phase of an RF signal shifted by the second phase shifter 352. According to various embodiments, the phase of the RF signal shifted by the first phase shifter 351 and the phase of the RF signal shifted by the second phase shifter 352 may have a phase difference of 90 degrees therebetween.

According to an embodiment, the first amplifier 331 and the third amplifier 333 may operate differently due to a phase difference between RF signals supplied to the first amplifier 331 and the third amplifier 333. For example, in the case where a phase of an RF signal shifted by the first phase shifter 351 and a phase of an RF signal shifted by the second phase shifter 352 have a phase difference of 90 degrees therebetween, the third amplifier 333 may operate as an amplifier at the time point at which the first amplifier 331 is saturated.

According to an embodiment, the first antenna module 321, the second antenna module 322, and the impedance matching unit 361 may be arranged in a single chip. According to various embodiments, the first antenna module 321 and the second antenna module 322 may be built in a single integrated circuit (i.e., chip), and the impedance matching unit 361 may be integral or mounted to a package substrate that the single chip is also mounted to, which is molded using a resin to create a packaged integrated circuit. For example, the impedance matching unit 361 may be implemented as a combination of a transmission line or a passive device in the package substrate.

According to an embodiment, the impedance matching unit 361 shifts the phase of an output signal of the first amplifier 331 or the phase of an output signal of the third amplifier 333 by 90 degrees to combine the output signals of the first amplifier 331 and the third amplifier 333. According to various embodiments, a phase difference between an output RF signal of the first amplifier 331 and an output RF signal of the third amplifier 333, which is generated due to the first phase shifter 351, may be matched through the impedance matching unit 361.

According to an embodiment, the internal structures of the third antenna module 323 and the fourth antenna module 324 may also be the same as or similar to the internal structures of the first antenna module 321 and the second antenna module 322. For example, each of the third antenna module 323 and the fourth antenna module 324 may also include a phase shifter, a switch, and a power amplifier corresponding thereto.

According to an embodiment, the electronic device 300 configures a first chain through the first antenna module 321, a second chain through the second antenna module 322, a third chain through the third antenna module 323, and a fourth chain through the fourth antenna module ray 324.

According to various embodiments, the electronic device 300 may have a multi-chain structure including four chains, which includes the first antenna module 321, the second antenna module 322, the third antenna module 323, and the fourth antenna module 324.

According to an embodiment, in the case where two chains are configured using the first antenna module 321 and the second antenna module 322, the first amplifier 331 included in the first antenna module 321 may operate as a carrier amplifier, and the third amplifier 333 included in the second antenna module 322 may operate as a peaking amplifier.

Figure 4:
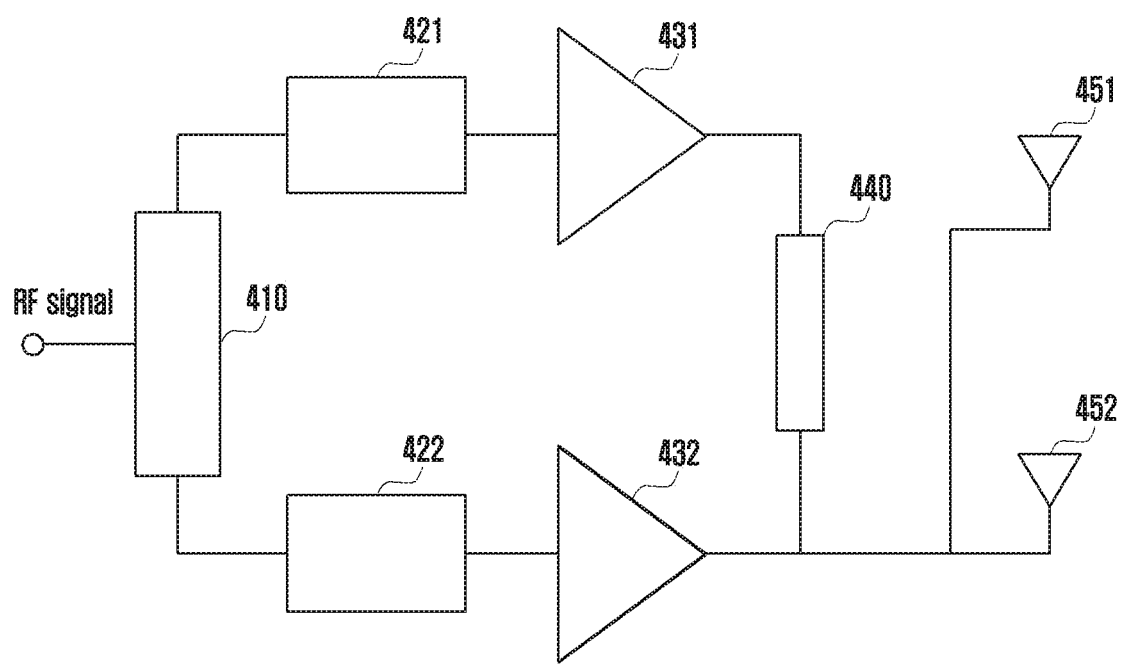
FIG. 4 illustrates a power amplification algorithm according to an embodiment of the disclosure.

FIG. 4 illustrates a power amplification algorithm according to an embodiment of the disclosure.

Referring to FIG. 4, power amplification of the RF signal may be performed using a power distributor 410, a first phase shifter 421, a second phase shifter 422, a first amplifier 431, a second amplifier 432, an impedance matching unit 440, a first antenna 451, and a second antenna 452.

According to an embodiment, the power distributor 410 may distribute to, a first phase shifter 421 and a second phase shifter 422, an RF signal supplied from a communication circuit. According to various embodiments, the number of chains of an electronic device including the power amplification algorithm may be determined on the basis of the number of RF signals distributed through the power distributor 410. For example, in the case where the power distributor 410 distributes to 16 phase shifters, an RF signal supplied from the communication circuit, the electronic device may include 16 multi-chain structures.

According to an embodiment, the RF signal passing through the first phase shifter 421, the first amplifier 431, the impedance matching unit 440, and the first antenna 451 may configure a first chain. The RF signal passing through the second phase shifter 422, the second amplifier 432, and the second antenna 452 may configure a second chain.

According to an embodiment, the first phase shifter 421 may shift a phase of the received RF signal as much as a first angle and transfer the shifted RF signal to the first amplifier 431. According to various embodiments, the second phase shifter 422 may shift a phase of the received RF signal as much as a second angle and transfer the shifted RF signal to the second amplifier 432. For example, the first phase shifter 421 may shift the phase of the received RF signal as much as 120 degrees and transfer the shifted RF signal to the first amplifier 431, and the second phase shifter 422 may shift the phase of the received RF signal as much as 30 degrees and transfer the shifted RF signal to the second amplifier 432.

According to an embodiment, the first amplifier 431 and the second amplifier 432 may amplify and output the power of the received RF signal. According to various embodiments, the first amplifier 431 may operate as a carrier amplifier, and the second amplifier 432 may operate as a peaking amplifier. According to an embodiment, an operating region of the first amplifier 431 and an operating region of the second amplifier 432 may be different from each other. For example, the second amplifier 432 may perform power amplification in the case where the first amplifier 431 is saturated.

According to an embodiment, the impedance matching unit 440 may have a quarter-wave transformer characteristic. The impedance matching unit 440 may compensate for a phase difference between an output signal of the first amplifier 431 and an output signal of the second amplifier 432, the phase difference occurring due to the first phase shifter 421 and the second phase shifter 422.

Figure 5:
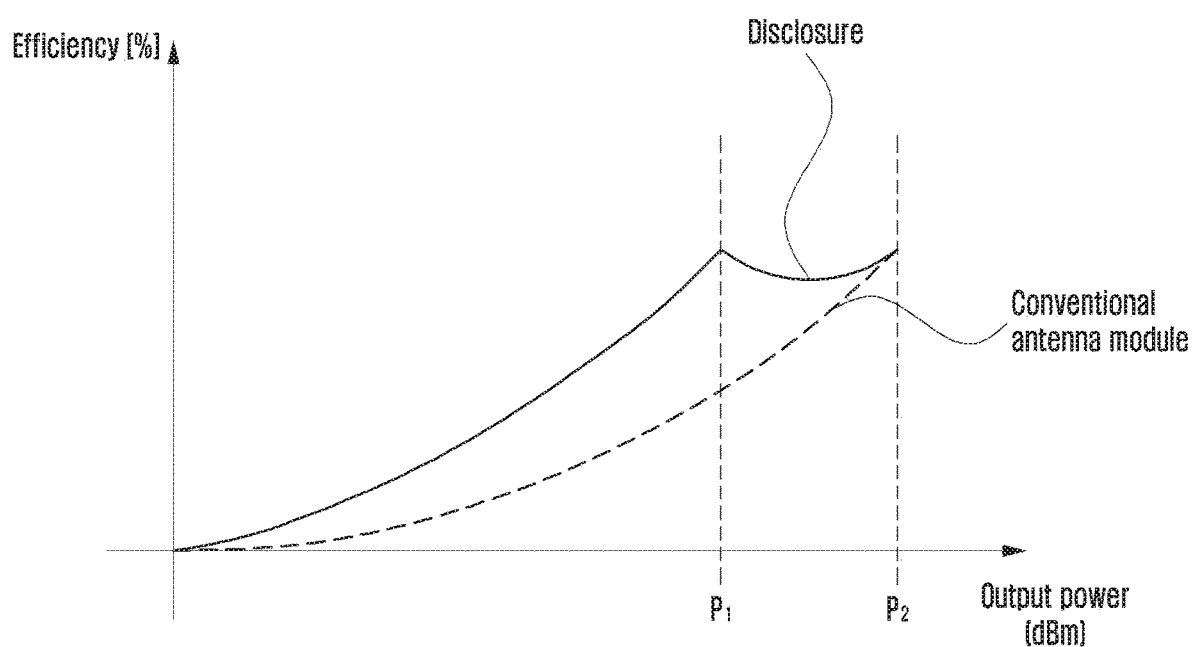
FIG. 5 illustrates a graph of an efficiency comparison between an electronic device according to an embodiment of the disclosure and an electronic device according to the conventional art according to an embodiment of the disclosure.

FIG. 5 illustrates a graph of an efficiency comparison between an electronic device according to an embodiment of the disclosure and an electronic device according to the conventional art according to an embodiment of the disclosure.

Referring to FIG. 5, when the output power is $P_1$, the efficiency of an antenna module according to an embodiment of the disclosure is significantly improved compared to a conventional antenna module. For example, according to the disclosure, an antenna efficiency in the case where output power is $P_1$ is similar to an antenna efficiency in the case where the maximum output power is $P_2$.

According to an embodiment, $P_1$ may be a 6 dB back-off parameter of $P_2$ the maximum output power. According to various embodiments, in the 5G mobile communication system, an antenna module may operate in a region where output power is lower than the maximum output power due to a high peak-to-average power ratio (PAPR) characteristic. Therefore, according to an antenna module structure disclosed in the disclosure, even if the operation output power of an antenna module is lowered, the high efficiency of the antenna module can be maintained.

The disclosure provides an electronic device including: a first antenna module including a first amplifier configured to amplify a signal received from a communication circuit; a second antenna module including a second amplifier configured to amplify a signal received from the communication circuit; and an impedance matching unit disposed between an output terminal of the first amplifier and an output terminal of the second amplifier.

According to an embodiment, the impedance matching unit may be a transmission line having a length of $\lambda/4$.

According to an embodiment, the impedance matching unit is a passive device having a phase of $\lambda/4$.

According to an embodiment, the first antenna module may include a first phase shifter connected to an input terminal of the first amplifier and shifting the phase of a signal received from the communication circuit, and the second antenna module may include a second phase shifter connected to an input terminal of the second amplifier and shifting the phase of a signal received from the communication circuit.

According to an embodiment, the phase difference between the phase shifted by the first phase shifter and the phase shifted by the second phase shifter may be 90 degrees.

According to an embodiment, the second amplifier may operate in the case where the first amplifier is saturated.

According to an embodiment, a first RF chain may be configured through the first antenna module, a second RF chain may be configured through the second antenna module, and beam sweeping may be performed using the first antenna module and the second antenna module.

According to an embodiment, the first antenna module, the second antenna module, and the impedance matching unit may be built in a chip.

According to an embodiment, the first antenna module and the second antenna module may be built in a chip, and the impedance matching unit may be included in a packaging module including the chip.

According to an embodiment, the impedance matching unit may shift the phase of an output signal of the first amplifier or the phase of an output signal of the second amplifier by 90 degrees so as to combine the output signal of the first amplifier and the output signal of the second amplifier.

The disclosure may include: a first antenna module including a first amplifier configured to amplify a signal received from a communication circuit; a second antenna module including a second amplifier configured to amplify a signal received from the communication circuit; and an impedance matching unit disposed between an output terminal of the first amplifier and an output terminal of the second amplifier.

According to an embodiment, the impedance matching unit may be a transmission line having a length of $\lambda/4$.

According to an embodiment, the impedance matching unit is a passive device having a phase of $\lambda/4$.

According to an embodiment, the first antenna module may include a first phase shifter connected to an input terminal of the first amplifier and shifting the phase of a signal received from the communication circuit, and the second antenna module may include a second phase shifter connected to an input terminal of the second amplifier and shifting the phase of a signal received from the communication circuit.

According to an embodiment, the phase difference between the phase shifted by the first phase shifter and the phase shifted by the second phase shifter may be 90 degrees.

According to an embodiment, the second amplifier may operate in the case where the first amplifier is saturated.

According to an embodiment, a first RF chain may be configured through the first antenna module, a second RF chain may be configured through the second antenna module, and beam sweeping may be performed using the first antenna module and the second antenna module.

According to an embodiment, the first antenna module, the second antenna array, and the impedance matching unit may be built in a chip.

According to an embodiment, the first antenna module and the second antenna module may be built in a chip, and the impedance matching unit may be included in a packaging module including the chip.

According to an embodiment, the impedance matching unit may shift the phase of an output signal of the first amplifier or the phase of an output signal of the second amplifier by 90 degrees so as to combine the output signal of the first amplifier and the output signal of the second amplifier.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a first antenna module including a first amplifier configured to amplify a signal received from a communication circuit;
   a second antenna module including a second amplifier configured to amplify a signal received from the communication circuit;
   an impedance matching circuit disposed between an output terminal of the first amplifier and an output terminal of the second amplifier, wherein a first terminal of the impedance matching circuit is connected to the output terminal of the first amplifier, and wherein a second terminal of the impedance matching circuit is connected to the output terminal of the second amplifier; and
   a first antenna connected to a second antenna, the second terminal of the impedance matching circuit, and the output terminal of the second amplifier, wherein the second antenna is connected to the first antenna, the second terminal of the impedance matching circuit, and the output terminal of the second amplifier.

2. The electronic device of claim 1, wherein the impedance matching circuit comprises a transmission line having a length of $\lambda/4$.

3. The electronic device of claim 1, wherein the impedance matching circuit comprises a passive device having a phase of $\lambda/4$.

4. The electronic device of claim 1,
wherein the first antenna module includes a first phase shifter connected to an input terminal of the first amplifier for shifting a phase of the signal received from the communication circuit, and
wherein the second antenna module includes a second phase shifter connected to an input terminal of the second amplifier for shifting the phase of the signal received from the communication circuit.

5. The electronic device of claim 4, wherein a phase difference between a phase shifted by the first phase shifter and a phase shifted by the second phase shifter is 90 degrees.

6. The electronic device of claim 1, wherein the second amplifier operates in a case where the first amplifier is saturated.

7. The electronic device of claim 1,
wherein a first radio frequency (RF) chain is configured through the first antenna module,
wherein a second RF chain is configured through the second antenna module, and
wherein the first antenna module and the second antenna module are configured to perform a beam sweep.

8. The electronic device of claim 1, wherein the first antenna module, the second antenna module, and the impedance matching circuit are formed on a single integrated circuit.

9. The electronic device of claim 1,
wherein the first antenna module and the second antenna module are integral into a single integrated circuit that is mounted on a packaging substrate, and
wherein the impedance matching circuit is mounted to or integral to the packaging substrate.

10. The electronic device of claim 1, wherein the impedance matching circuit shifts a phase of an output signal of the first amplifier or a phase of an output signal of the second amplifier by 90 degrees and combines the output signal of the first amplifier and the output signal of the second amplifier.

11. An antenna module comprising:
a first antenna module including a first amplifier configured to amplify a signal received from a communication circuit;
a second antenna module including a second amplifier configured to amplify a signal received from the communication circuit;
an impedance matching circuit disposed between an output terminal of the first amplifier and an output terminal of the second amplifier, wherein a first terminal of the impedance matching circuit is connected to the output terminal of the first amplifier, and wherein a second terminal of the impedance matching circuit is connected to the output terminal of the second amplifier; and
a first antenna connected to a second antenna, the second terminal of the impedance matching circuit, and the output terminal of the second amplifier,
wherein the second antenna is connected to the first antenna, the second terminal of the impedance matching circuit, and the output terminal of the second amplifier.

12. The antenna module of claim 11, wherein the impedance matching circuit comprises a transmission line having a length of $\lambda/4$.

13. The antenna module of claim 11, wherein the impedance matching circuit comprises a passive device having a phase of $\lambda/4$.

14. The antenna module of claim 11,
wherein the first antenna module includes a first phase shifter connected to an input terminal of the first amplifier and shifting a phase of the signal received from the communication circuit, and
wherein the second antenna module includes a second phase shifter connected to an input terminal of the second amplifier and shifting a phase of the signal received from the communication circuit.

15. The antenna module of claim 14, a phase difference between a phase shifted by the first phase shifter and a phase shifted by the second phase shifter is 90 degrees.

16. The antenna module of claim 11, wherein the second amplifier operates in a case where the first amplifier is saturated.

17. The antenna module of claim 11,
wherein a first radio frequency (RF) chain is configured through the first antenna module, and
wherein a second RF chain is configured through the second antenna module, and beam sweeping is performed using the first antenna module and the second antenna module.

18. The antenna module of claim 11, wherein the first antenna module, the second antenna module, and the impedance matching circuit are formed on a single integrated circuit.

19. The antenna module of claim 11,
wherein the first antenna module and the second antenna module are integral into a single integrated circuit that is mounted on a packaging substrate, and
wherein the impedance matching circuit is mounted to or integral to the packaging substrate.

20. The antenna module of claim 11,
wherein the impedance matching circuit shifts a phase of an output signal of the first amplifier or a phase of an output signal of the second amplifier by 90 degrees and combines the output signal of the first amplifier and the output signal of the second amplifier.

* * * * *